(12) United States Patent
Asano et al.

(10) Patent No.: US 7,313,781 B2
(45) Date of Patent: Dec. 25, 2007

(54) IMAGE DATA CORRECTION METHOD, LITHOGRAPHY SIMULATION METHOD, IMAGE DATA CORRECTION SYSTEM, PROGRAM, MASK AND METHOD OF MANUFACTURING A SEMICONDUCTOR DEVICE

(75) Inventors: Mitsuyo Asano, Yokohama (JP); Masamitsu Itoh, Yokohama (JP); Eiji Yamanaka, Tokyo (JP); Shinji Yamaguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 11/138,408

(22) Filed: May 27, 2005

(65) Prior Publication Data

US 2005/0265592 A1    Dec. 1, 2005

(30) Foreign Application Priority Data

May 28, 2004   (JP)   ............................. 2004-159953

(51) Int. Cl.
    *G06F 17/50*   (2006.01)
(52) U.S. Cl. ................................. 716/19; 716/4; 716/21
(58) Field of Classification Search ............... 716/4, 716/19; 702/59; 430/22, 30
    See application file for complete search history.

(56) References Cited

U.S. PATENT DOCUMENTS 5,736,280 A *   4/1998   Tsudaka .................... 430/30
6,436,595 B1 *  8/2002   Credendino et al. ......... 430/22
7,043,712 B2 *  5/2006   Mukherjee et al. .......... 716/19
7,120,285 B1   10/2006   Spence
2004/0133369 A1 * 7/2004 Pack et al. .................. 702/59

FOREIGN PATENT DOCUMENTS

| JP | 2687781 | 8/1997 |
|---|---|---|
| JP | 2002-231607 | 8/2002 |
| JP | 2002-344724 | 11/2002 |
| JP | 2003-31469 | 1/2003 |
| JP | 2004-37579 | 2/2004 |

OTHER PUBLICATIONS

W.C. Wang et al., "Mask Pattern Fidelity Quantification Method", Proceedings of SPIE, vol. 5256, pp. 266-275, (2003).
Notification of Reasons for Rejection issued by the Japanese Patent Office, mailed Jun. 5, 2007, in Japanese Patent Application No. 2005-151063 and English-language translation of Notification.

* cited by examiner

*Primary Examiner*—Leigh M. Garbowski
(74) *Attorney, Agent, or Firm*—Finnegan, Henderson, Farabow, Garrett & Dunner, L.L.P.

(57) ABSTRACT

An image data correction method includes preparing correction data for correcting a distortion of an image obtained by an image acquiring section, acquiring outline data of a desired pattern obtained by the image acquiring section, and correcting the outline data of the desired pattern using the correction data.

18 Claims, 9 Drawing Sheets

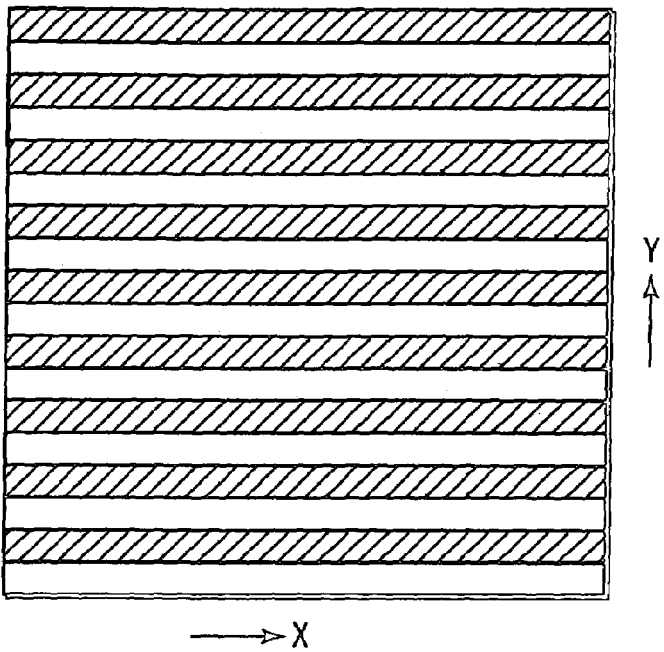
FIG. 3B
FIG. 4
| Ax | 1.0398E+00 | Ay | 8.8217E−01 |
|---|---|---|---|
| Bx | −5.0600E−05 | By | −9.4072E−07 |
| Cx | −7.5696E−07 | Cy | 7.5070E−06 |
| Dx | 1.6840E−08 | Dy | 6.7982E−10 |
| Ex | 8.0362E−10 | Ey | −1.2270E−09 |
| Fx | −2.6820E−11 | Fy | −2.9251E−09 |
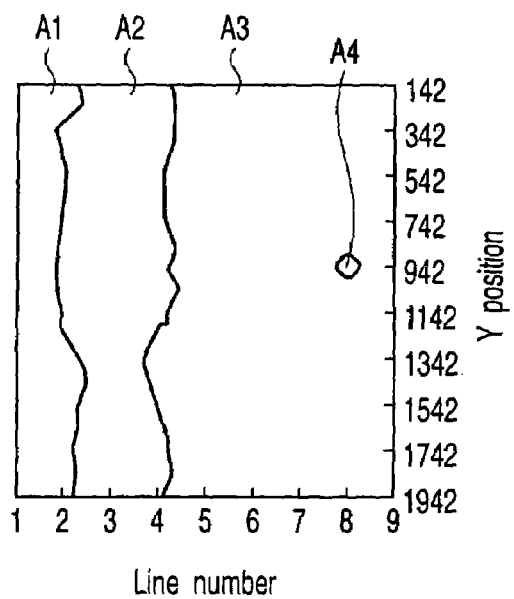
FIG. 5A
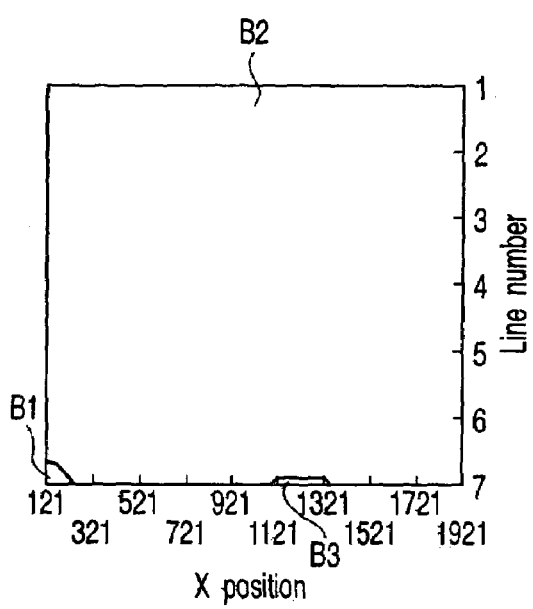
FIG. 5B

|    | 10K       | 20K       | 40K       |
|----|-----------|-----------|-----------|
| Ax | 2.08E+00  | 1.04E+00  | 5.17E−01  |
| Bx | −1.10E−04 | −5.06E−05 | −2.26E−05 |
| Cx | 2.74E−06  | −7.57E−07 | 7.64E−08  |
| Dx | 3.58E−08  | 1.68E−08  | 8.26E−09  |
| Ex | 9.15E−10  | 8.04E−10  | −3.90E−10 |
| Fx | −1.31E−09 | −2.68E−11 | 1.65E−10  |

|    | 10K       | 20K       | 40K       |
|----|-----------|-----------|-----------|
| Ay | 1.77E+00  | 8.82E−01  | 4.41E−01  |
| By | 3.37E−07  | −9.41E−07 | −8.99E−07 |
| Cy | 3.84E−06  | 7.51E−06  | 5.59E−06  |
| Dy | −3.20E−10 | 6.80E−10  | 4.07E−10  |
| Ey | −9.69E−10 | −1.23E−09 | −1.10E−10 |
| Fy | −1.75E−09 | −2.93E−09 | −2.57E−09 |

IMAGE DATA CORRECTION METHOD, LITHOGRAPHY SIMULATION METHOD, IMAGE DATA CORRECTION SYSTEM, PROGRAM, MASK AND METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2004-159953, filed May 28, 2004, the entire contents of which are incorporated herein by reference.

BACKGROUND OF THE INVENTION

1. Field of the Invention

The present invention relates to image data correction method and lithography simulation method.

2. Description of the Related Art

With high integration and scale-down of semiconductor devices, it is important to predict lithography latitude from a mask pattern actually formed on a photo mask with high precision.

JPN. PAT. APPLN. KOKAI Publication No. 2004-37579 has proposed the following method as a method of predicting the lithography latitude from a two-dimensional pattern of an actual mask. According to the method, a mask pattern image is acquired using an SEM, and carry out lithography simulation using the outline data extracted from SEM image.

The mask pattern image is acquired using an image acquiring apparatus such as scanning electron microscope (SEM). However, image distortion exists in the image acquiring apparatus in general; for this reason, it is difficult to acquire micro pattern image. For example, image distortion resulting from the distortion of scan beam exists in the foregoing SEM. For this reason, there is a problem that an error of the edge position of outline data extracted from images having distortion gives a large influence to the lithography simulation result.

Japanese Patent No. 2687781 has proposed the following method as a method of correcting the image distortion. According to the method, correction data is previously obtained from image data of a reference pattern, and then, image data of a target pattern is corrected using the correction data.

However, according the foregoing conventional method, data becomes huge to correct the image data of the entire target pattern. This is a factor of causing a problem that it takes much time to make calculation for correction. Consequently, it is difficult to perform highly precise correction for the image pattern in small amount of data at high speed.

BRIEF SUMMARY OF THE INVENTION

According to a first aspect of the present invention, there is provided an image data correction method comprising: preparing correction data for correcting a distortion of an image obtained by an image acquiring section; acquiring outline data of a desired pattern obtained by the image acquiring section; and correcting the outline data of the desired pattern using the correction data.

According to a second aspect of the present invention, there is provided a lithography simulation method comprising: preparing correction data for correcting a distortion of an image obtained by an image acquiring section; acquiring outline data of a desired pattern obtained by the image acquiring section; correcting the outline data of the desired pattern using the correction data; and carrying out lithography simulation with respect to the desired pattern using the corrected outline data.

According to a third aspect of the present invention, there is provided an image data correction system comprising: a correction data storage section storing correction data for correcting a distortion of an image obtained by an image acquiring section; an outline data storage section storing outline data of a desired pattern obtained by the image acquiring section; and a correction section correcting the outline data of the desired pattern using the correction data.

According to a fourth aspect of the present invention, there is provided a computer program product configured to store program instructions for execution on a computer, the program instructions causing the computer to perform: acquiring correction data for correcting a distortion of an image obtained by an image acquiring section; acquiring outline data of a desired pattern obtained by the image acquiring section; and correcting the outline data of the desired pattern using the correction data.

According to a fifth aspect of the present invention, there is provided a mask comprising: a desired pattern; and a test pattern used for calculating correction data for correcting outline data of the desired pattern obtained by an image acquiring section.

According to a sixth aspect of the present invention, there is provided a method of manufacturing a semiconductor device, comprising: preparing the mask; and projecting the desired pattern provided on the mask onto a resist film on a semiconductor substrate.

BRIEF DESCRIPTION OF THE SEVERAL VIEWS OF THE DRAWING

FIGS. 3A and 3B are views showing standard patterns according to the first embodiment of the present invention;

FIG. 4 is a table showing coefficients of approximate equations used as correction data according to the first embodiment of the present invention;

FIGS. 5A and 5B are views showing pixel size two-dimensional distribution according to the first embodiment of the present invention;

DETAILED DESCRIPTION OF THE INVENTION

Embodiments of the present invention will be described below with reference to the accompanying drawings.

FIRST EMBODIMENT

Figure 1:
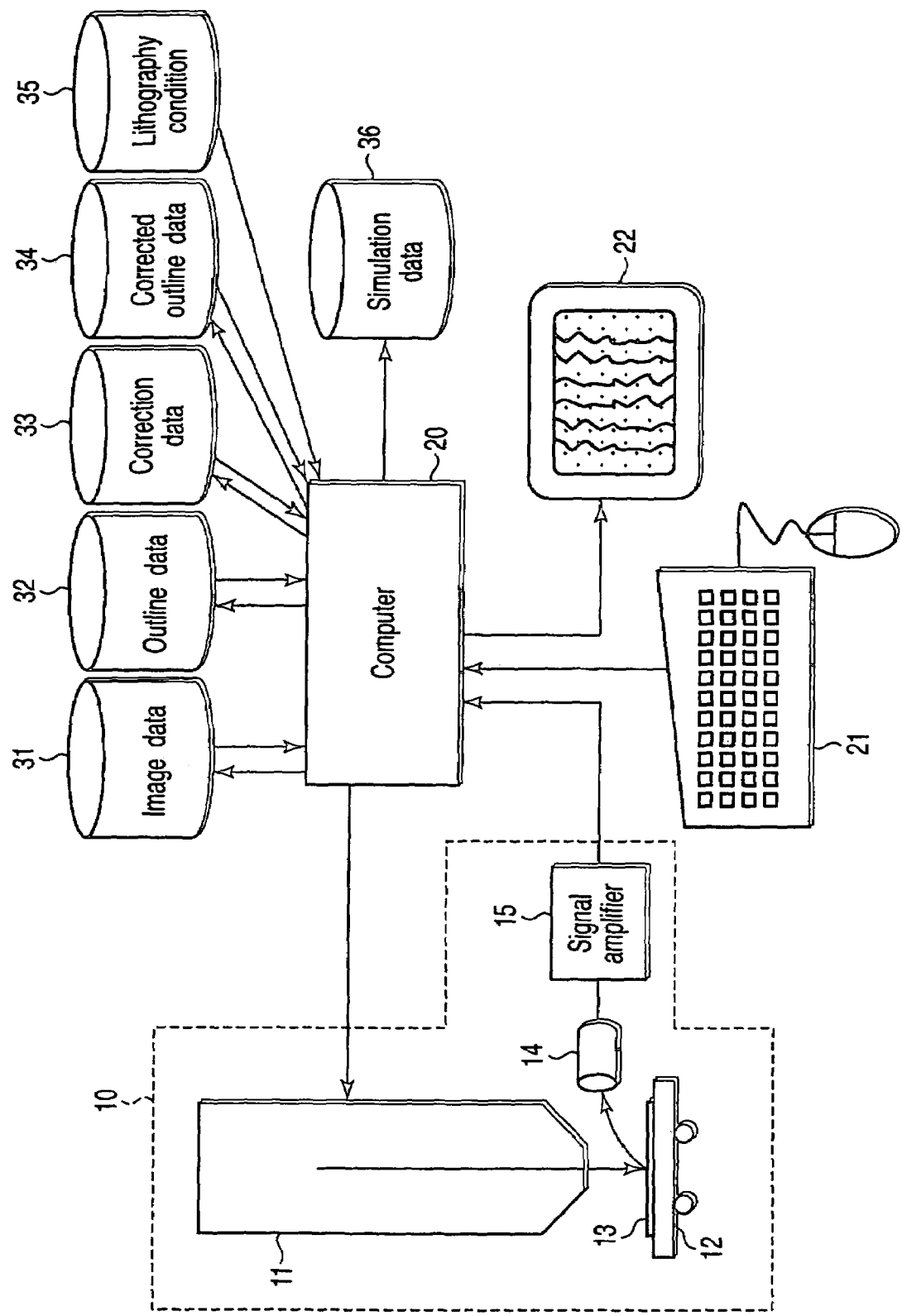
FIG. 1 is a view to explain the configuration of an image data correction system according to a first embodiment of the present invention.

FIG. 1 is a view to explain the configuration of an image data correction system according to a first embodiment of the present invention.

An image acquiring section (image acquiring apparatus) 10 comprises a scanning electron microscope (SEM). In the image acquiring section 10, an electron beam from an electron beam supplier 11 is radiated to a photo mask 13 placed on a stage 12. A detector 14 detects the electron beam reflected on the surface of the photo mask 13 to acquire a pattern image formed on the photo mask 13. The image data (information) detected thus is supplied to a computer 20 via a signal amplifier 15.

The computer 20 is connected with operation board 21 (keyboard) for giving instructions to the computer 20, and image display 22 (CRT) for displaying an image acquired by the image acquiring section 10.

An image data storage section 31 stores image data of images acquired by the image acquiring section 10. A photo mask 13 actually used to form semiconductor devices such as LSI is placed on the stage 12. In this case, the image data storage section 31 stores image data of device patterns (desired pattern) such as wiring (interconnect) pattern and contact hole pattern formed in the photo mask 13. Moreover, a photo mask 13 formed with standard pattern for preparing correction data is placed on the stage 12. In this case, the image data storage section 31 stores image data of the standard pattern.

An outline data storage section 32 stores outline data of the foregoing device pattern. The outline data is extracted from subjecting predetermined processing with respect to the image data stored in the image data storage section 31.

A correction data storage section 33 stores correction data for correcting a distortion of the image obtained by the image acquiring section 10. The correction data is prepared via the following processing using the image data of the standard pattern.

A corrected outline data storage section 34 stores outline data in which image distortion is corrected. The outline data stored in the outline data storage section 32 is corrected using the correction data stored in the correction data storage section 33. By doing so, it is possible to obtain corrected outline data in which image distortion is corrected.

A lithography condition storage section 35 stores lithography condition data. The lithography condition data is used when a device pattern formed on a photo mask is transferred onto photo resist on a semiconductor wafer to form a photo resist pattern.

A simulation data storage section 36 stores the result of lithography simulation made using the data given below. One is corrected outline data stored in the corrected outline data storage section 34. Another is the lithography condition data stored in the lithography condition storage section 35. The simulation result obtained from the lithography simulation includes the lithography latitude predicted result when forming the foregoing photo resist pattern.

Incidentally, the computer 20 carries out the foregoing various data processings and lithography simulation.

Figure 2:
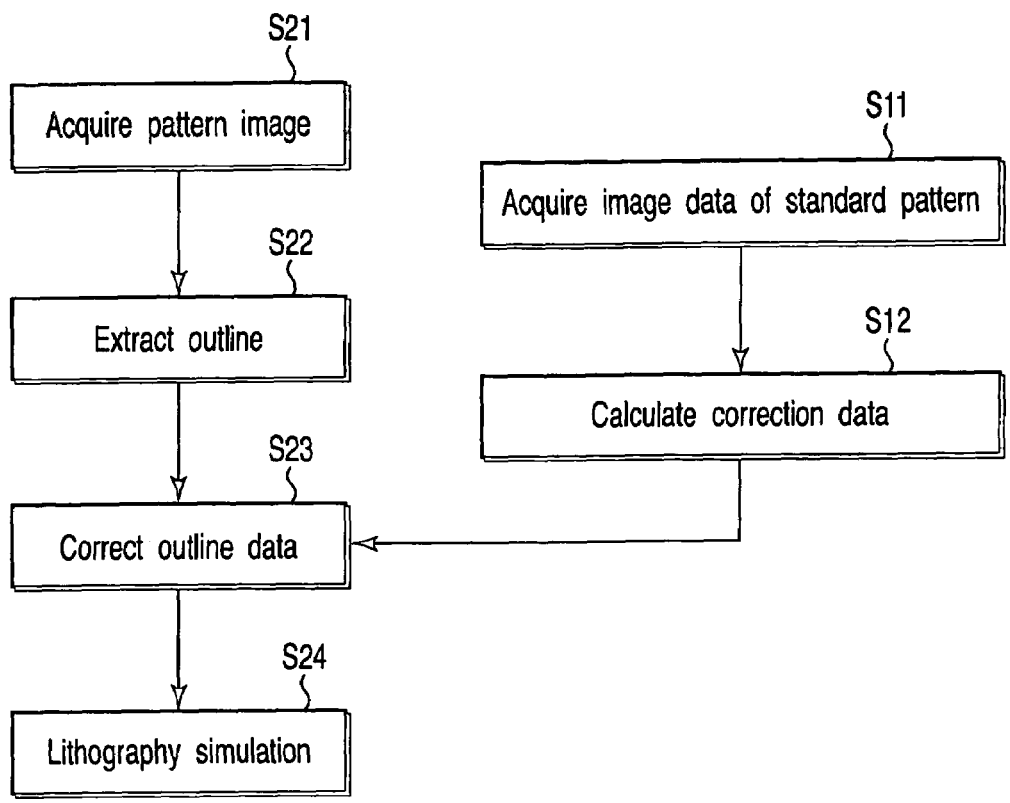
FIG. 2 is a flowchart to explain an image data correction method according to the first embodiment of the present invention.

The procedures taken using the system shown in FIG. 1 will be explained below with reference to the flowchart shown in FIG. 2.

The photo mask formed with the standard pattern is placed on the stage 12 in the image acquiring section 10 to acquire image data of the standard pattern (S11). The image acquiring condition is as follows.

Accelerating voltage: 1500V
Process piece current: 8 pA
Number of Pixels: 2048×2048
Magnification: 20000

Figure 3A:
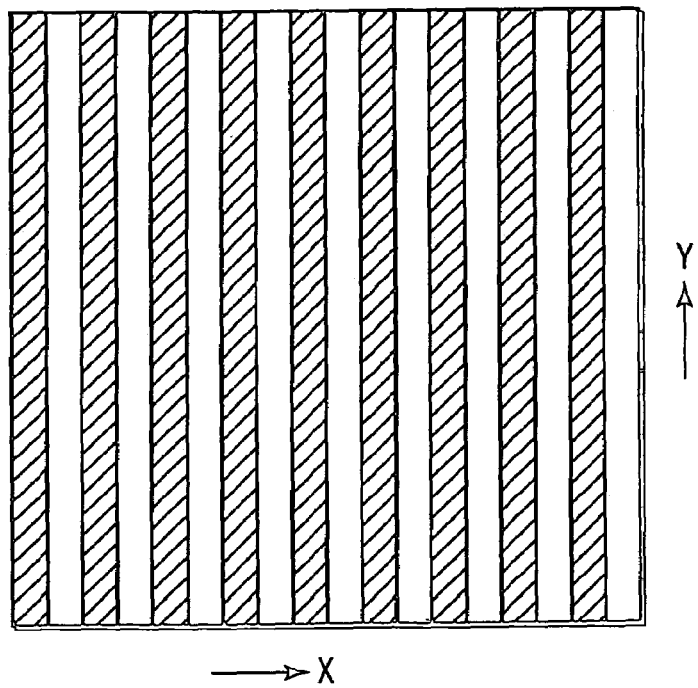

As shown in FIGS. 3A and 3B, a line and space (L/S) pattern having constant line and space width is used as the standard pattern. The image data of the standard pattern acquired by the image acquiring section 10 is sent to the computer 20 to calculate outline data (edge data).

The number of pixels included in one pitch of the line and space pattern is calculated from the obtained outline data. The pitch of periodic patterns, such as L/S on a photo mask, is formed with the constant size comparatively with high precision, even when line width (W1) and space width (Ws) are varied by the place. Thus, if an image obtained by the image acquiring section 10 has no distortion, the number of pixels included in one pitch (one pitch width: W1+Ws) of the line and space pattern is constant regardless of places. However, image distortion necessarily exists in the actual image acquiring section 10. For this reason, the number of pixels included in one pitch of the line and space pattern changes depending on places. Therefore, the two-dimensional distribution of the number of pixels included in one pitch is calculated to obtain a pixel size two-dimensional distribution. According to the first embodiment, the pixel size two-dimensional distribution is expressed using the following quadric surface approximate equation (1).

$$Psx = Ax + Bx \cdot X + Cx \cdot Y + Dx \cdot X^2 + Ex \cdot X \cdot Y + Fx \cdot Y^2$$

$$Psy = Ay + By \cdot X + Cy \cdot Y + Dy \cdot X^2 + Ey \cdot X \cdot Y + Fy \cdot Y^2 \quad (1)$$

Where,

Psx: X-direction pixel size in the coordinate (X, Y)
Psy: Y-direction pixel size in the coordinate (X, Y)
Ax, Bx, Cx, Dx, Ex, Fx, Ay, By, Cy, Dy, Ey and Fy: coefficient According to the first embodiment, coefficients shown in FIG. 4 are obtained from the measurement result made in the manner described above. Moreover, pixel size two-dimensional distributions based on the quadric surface approximate equation are as shown in FIGS. 5A and 5B. In FIG. 5A, an area A1 denotes a pixel distribution area where the X-direction pixel size ranges from 1.02 to 1.03. An area A2 denotes a pixel distribution area where the X-direction pixel size ranges from 1.01 to 1.02. An area A3 denotes a pixel distribution area where the X-direction pixel size ranges from 1.00 to 1.01. An area A4-denotes a pixel distribution area where the X-direction pixel size ranges from 0.99 to 1.00. In FIG. 5B, an area B1 denotes a pixel distribution area where the Y-direction pixel size ranges from 0.89 to 0.90. An area B2 denotes a pixel distribution area where the Y-direction pixel size ranges from 0.88 to 0.89. An area B3 denotes a pixel distribution area where the Y-direction pixel size ranges from 0.87 to 0.88.

In the manner described above, correction data is calculated to correct the distortion of the image obtained by the image acquiring section 10 (S12). The correction data calculated thus is stored in the correction data storage section 33.

The process of carrying out lithography simulation using the outline data of the device pattern used for forming semiconductor devices such as LSI will be explained below.

A photo mask formed with device patterns such as interconnect pattern and contact hole pattern is placed on the stage 12 in the image acquiring section 10 to acquire image data of the device pattern (S21). The image acquiring condition is as follows.

Accelerating voltage: 1500V
Process piece current: 8 pA
Number of Pixels: 2048×2048
Magnification: 20000

Figure 6:
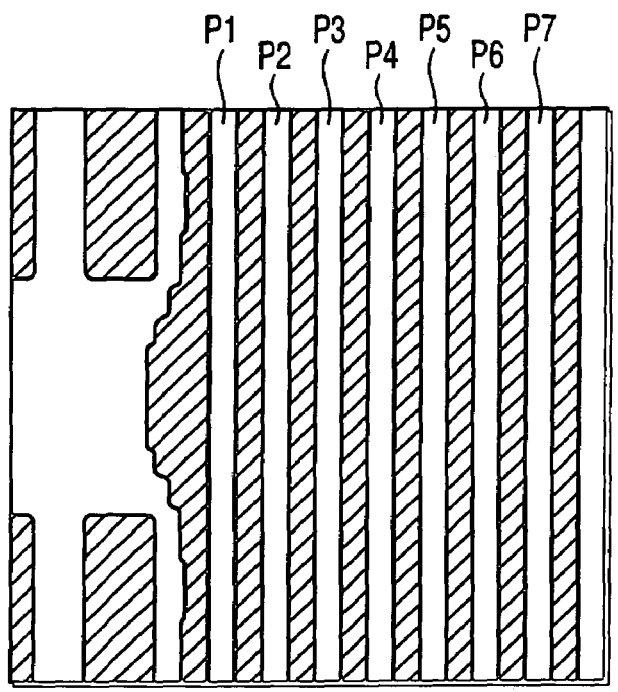
FIG. 6 is a view showing a device pattern according to the first embodiment of the present invention.

In this case, a device pattern shown in FIG. 6 is formed on the photo mask.

The device pattern image data acquired by the image acquiring section 10 is supplied to the computer 20 so that outline data (edge data) is extracted (S22). A threshold method is used to extract the outline, and the threshold is set to 50%, for example. The outline is extracted; as a result, the number of outputted X-Y coordinates is 36000. The outline data obtained thus is supplied to the outline data storage section 32.

Then, the outline data is corrected using correction data stored in the correction data storage section 33 (S23). By doing so, outline data correcting image distortion resulting from the image acquiring section 10 is obtained. Specifically, the outline data stored in the outline data storage section 32 is re-arranged using the correction data, thereby obtaining corrected outline data. The corrected outline data is stored in the corrected outline data storage section 34.

According to the present embodiment, the outline (edge) of the pattern is extracted, and thereafter, correction is made with respect to the extracted outline. Therefore, the calculation time spent for the correction is largely shortened while the memory capacity for storing the correction result is largely reduced. According to the present embodiment, the total number of pixels is 2048×2048. Thus, if correction is made with respect to the entire pixels of the pattern, 2048× 2048-time correction calculations are required in X and Y directions. On the contrary, if correction is made with respect to the outline as described in the present embodiment, correction is made with respect to only places where the outline is extracted. Thus, 36000-time correction calculations are merely made in X and Y directions. Moreover, data is stored with respect to only places where the outline is extracted; as a result, the memory capacity for storing the data is largely reduced.

Lithography simulation is carried out using the corrected outline data obtained thus (S24).

Figure 7:
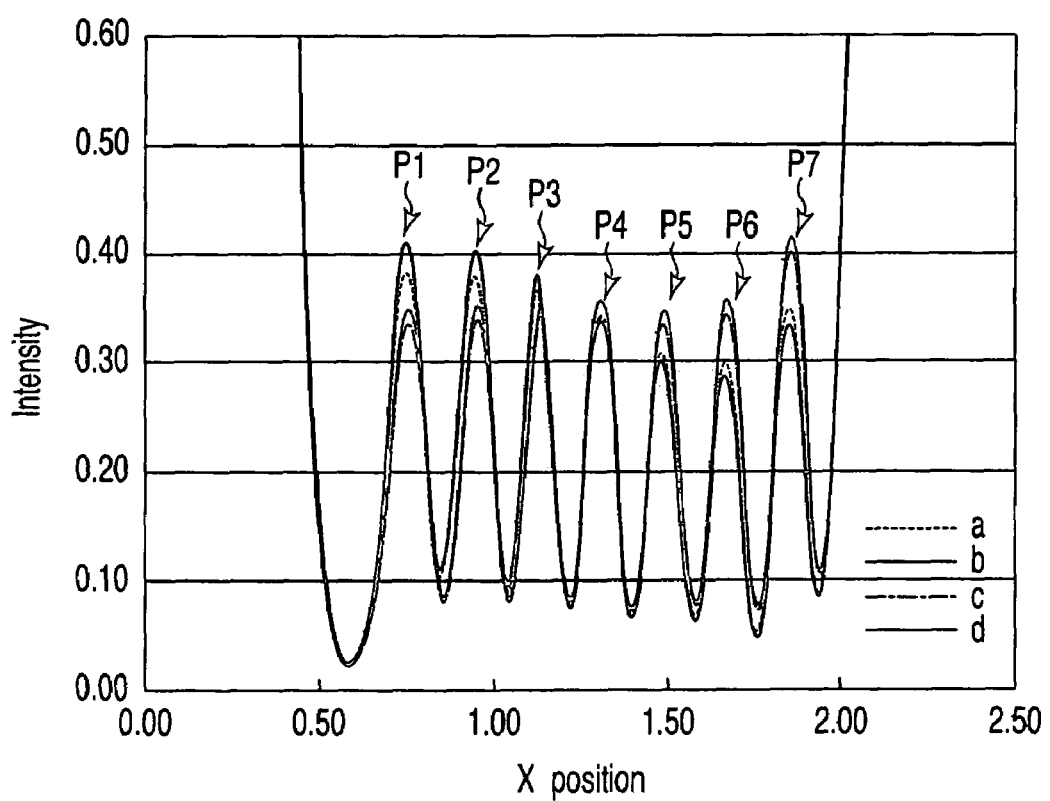
FIG. 7 is a view showing the image intensity profile obtained from simulation according to the first embodiment of the present invention.

FIG. 7 shows the profile of image intensity obtained by simulation. In FIG. 7, the line "a" shows image intensity when no outline correction is made, and the line "b" shows image intensity when XY magnification correction is made. On the other hand, the line "c" shows image intensity when outline correction is made (this embodiment), and the line "d" shows image intensity when a mask design data is used (corresponding to the case where no image distortion exists). In FIG. 7, P1 to P7 show each position of patterns shown in FIG. 6.

Figure 8:
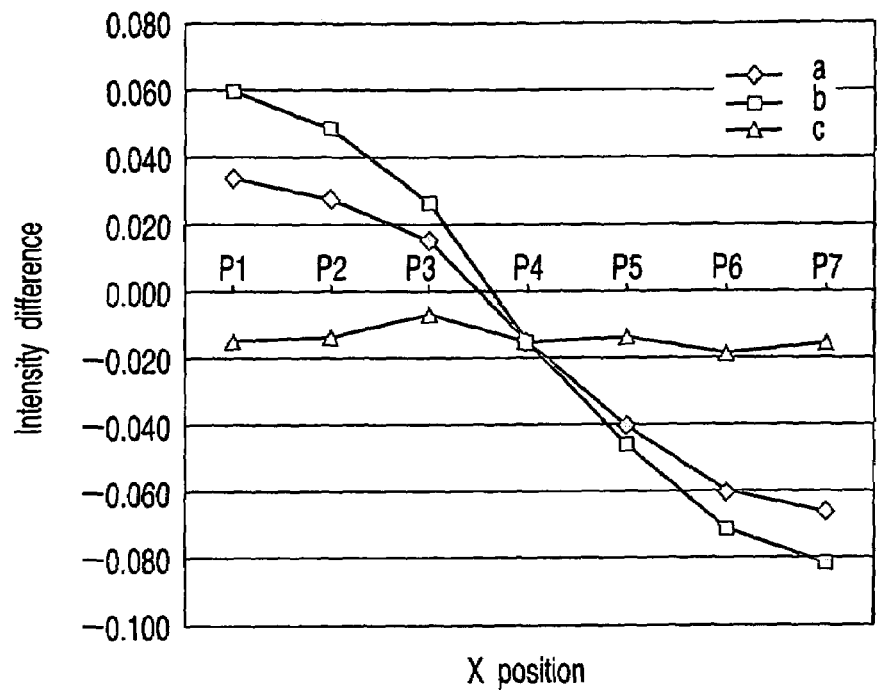
FIG. 8 is a view showing the intensity difference calculated from the image intensity profile according to the first embodiment of the present invention.

FIG. 8 is a graph showing the intensity difference in the peak value of each line shown in FIG. 7. In FIG. 8, the line "a" corresponds to the intensity difference between lines "a" and "d" shown in FIG. 7. The line "b" corresponds to the intensity difference between lines "b" and "d" shown in FIG. 7, and the line "c" corresponds to the intensity difference between lines "c" and "d" shown in FIG. 7.

As seen from FIGS. 7 and 8, the image intensity difference with respect to the case using the mask design data becomes larger when no outline correction is made (line "a" in FIGS. 7 and 8) and when XY magnification correction is made (line "b" in FIGS. 7 and 8). In particular, the intensity difference increases outside the image. This is because an error occurs in the outline position by the influence of image distortion existing in the image acquiring section 10.

On the other hand, the image intensity difference with respect to the case using the mask design data becomes smaller when outline correction is made according to the method of the embodiment (line "c" in FIGS. 7 and 8). Moreover, the image intensity difference is approximately constant regardless of image positions. This is because outline correction is made according to the method of the embodiment, and thereby, the influence of image distortion is largely reduced, and an error at the outline position becomes very small. Therefore, lithography simulation is carried out using data correcting the outline according to the method of the embodiment, and thereby, lithography latitude is predicted with high accuracy.

At least part of the method of the foregoing embodiment can be provided by a program executable the foregoing method procedures by the computer.

According to the first embodiment, the outline of the pattern obtained by the image acquiring section is extracted, and then, correction for correcting image distortion is made with respect to the extracted outline. Therefore, the amount of data required for correction is largely reduced. As a result, calculation time is largely shortened while data storage capacity is largely reduced. Moreover, even if the amount of data is largely reduced, the image distortion is accurately corrected, and the pattern is acquired with high accuracy.

In the foregoing embodiment, no reference is specially made with respect to the relationship between the magnification of the image acquiring section and the image distortion. The image distortion may be corrected considering the relationship between the magnification and the image distortion as described below.

Figures 9A, 9B:
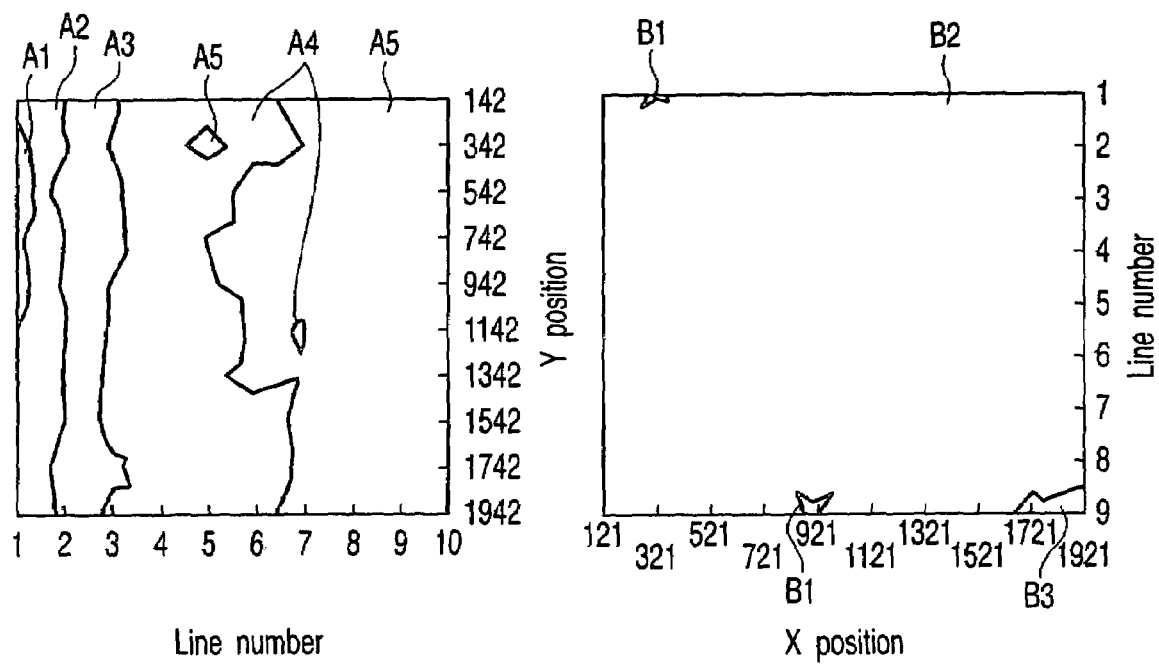
FIGS. 9A and 9B are views showing another pixel size two-dimensional distribution according to the first embodiment of the present invention.

In the image acquiring section such as scanning electron microscope, if the magnification changes, image distortion state also changes. FIGS. 9A and 9B show pixel size distribution when the magnification is 10000 (10 k times). FIG. 9A shows the X-direction pixel size distribution while FIG. 9B shows the Y-diction pixel size distribution. It can be seen that the pixel size distribution changes as compared with the case of FIGS. 5A and 5B (magnification: 20000 (20 k times).

Figures 10, 11:
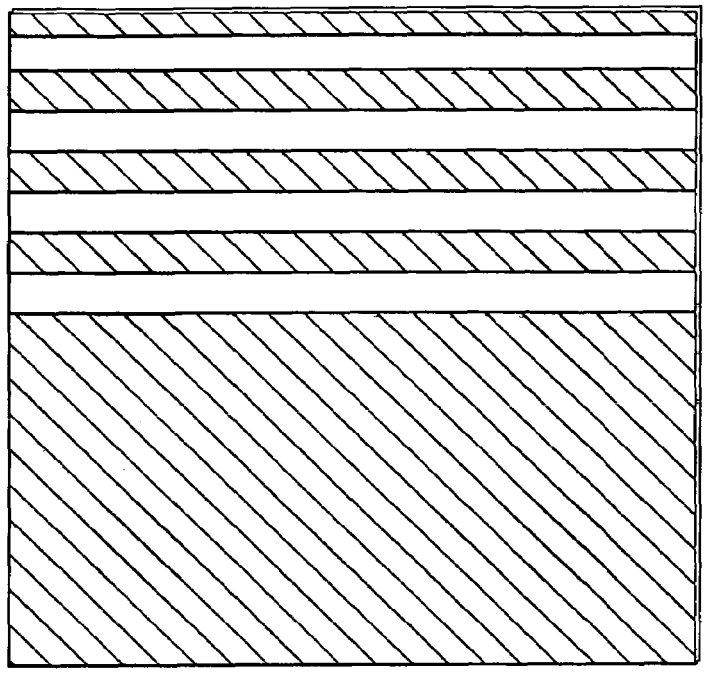
FIG. 10 is a table showing coefficients of approximate equations used as correction data according to the first embodiment of the present invention.
FIG. 11 is a view showing another test pattern according to the first embodiment of the present invention.

As described above, if the magnification of the image acquiring section changes, image distortion state also changes. For this reason, the foregoing coefficients of the quadric surface approximate equation changes depending on the magnification. FIG. 10 is a table showing the relationship between magnifications and coefficients Ax, Bx, Cx, Dx, Ex, Fx, Ay, By, Cy, Dy, Ey, Fy. The relationship shown in FIG. 10 is stored as a correction table, and thereby, proper correction is made in accordance with magnification.

In the foregoing embodiment, no reference is specially made with respect to the relationship between the occupied ratio of pattern included in the image acquired by the image acquiring section and image distortion. The image distortion may be corrected considering the relationship between the pattern occupied ratio and the image distortion as described below.

For example, the pattern occupied ratio (pattern coverage ratio on photo mask) is different between a pattern shown in FIG. 11 and the pattern shown in FIG. 6. If the pattern coverage ratio is different, surface potential of the photo mask is different when acquiring an image using the image acquiring section (electron microscope). For this reason, there is a possibility that the image distortion state changes.

As described above, if the pattern coverage ratio changes, the image distortion state also changes. For this reason, the foregoing coefficients of the quadric surface approximate equation changes depending on the pattern coverage ratio. Like the case of the magnification, the relationship between pattern coverage ratio and coefficients is stored as a correction table. By doing so, proper correction is made in accordance with pattern coverage ratio (pattern occupied ratio).

Besides, the following consideration should be made. Namely, image distortion state changes depending on focus position when observing the pattern. In also case, a correction table corresponding to the focus position is prepared, and correction is made in accordance with the focus position when observing a desired pattern.

In the foregoing embodiment, the photo mask is given as a measured object. The same method as described in the foregoing embodiment is applicable to the case of using EUV exposure mask and EB exposure mask. In the foregoing embodiment, the scanning electron microscope is used as the image acquiring section (image acquiring apparatus). In this case, an image acquiring apparatus other than the foregoing scanning electron microscope may be used.

SECOND EMBODIMENT

The second embodiment of the present invention will be explained below. In this case, the basic system configuration (see FIG. 1) and method are the same as the first embodiment. Therefore, the matters described in the first embodiment are applicable to the second embodiment unless special explanation is made.

Figure 12:
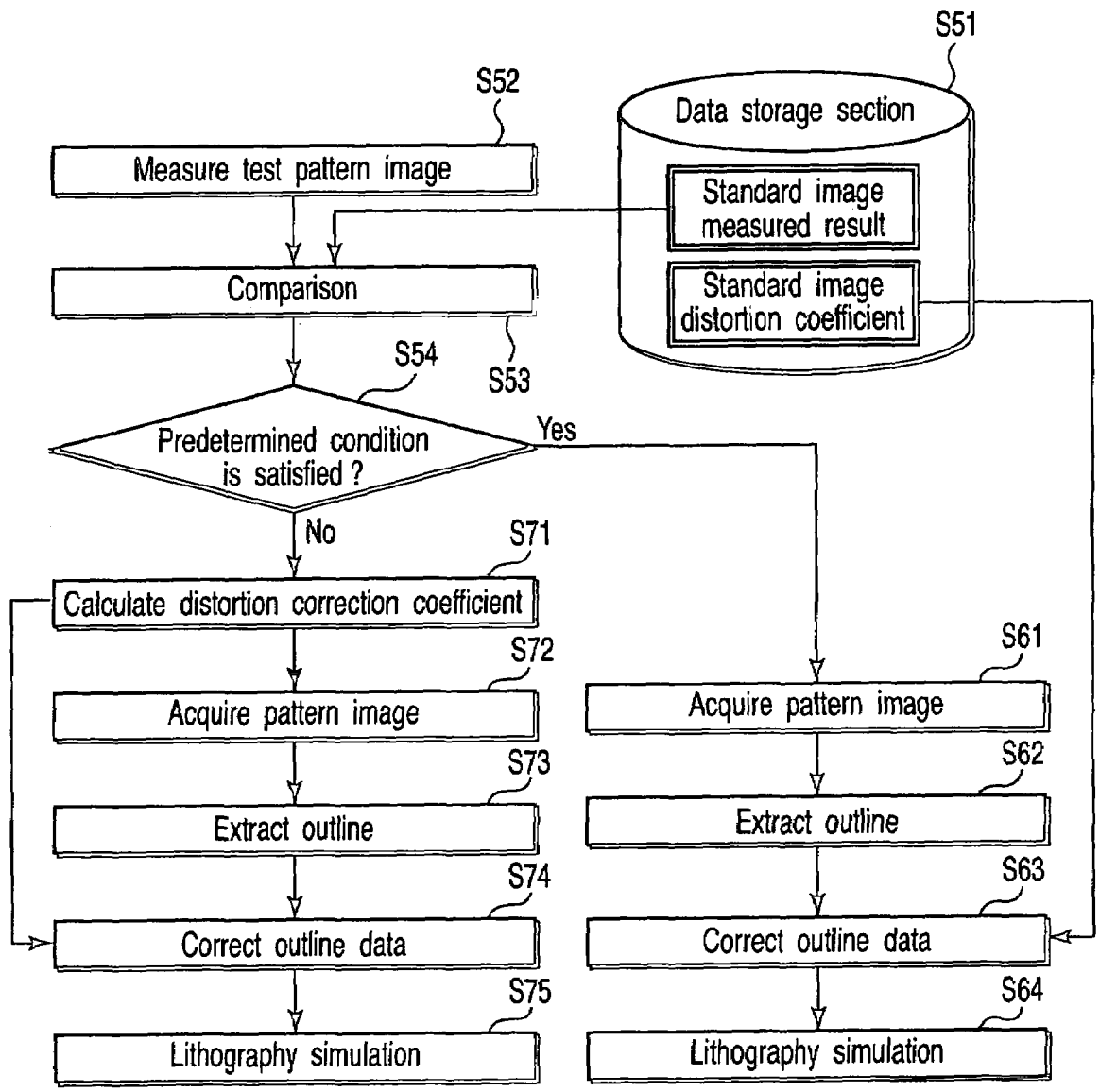
FIG. 12 is a flowchart to explain an image data correction method according to a second embodiment of the present invention.

FIG. 12 is a flowchart to explain the method according to the second embodiment.

First, a photo mask formed with a standard pattern is prepared, and thereafter, an image of the standard pattern is measured using the image acquiring section (SEM and the like). The measured result is stored in a data storage section as a standard image measured result. Moreover, a standard image distortion coefficient is calculated from the measured result, and then, stored in the data storage section (S51). The standard image distortion coefficient includes coefficients Ax, Bx, Cx, Dx, Ex, Fx, Ay, By, Cy, Dy, Ey and Fy shown in the equation (1) of the first embodiment.

A photo mask formed with device pattern (desired pattern) and test pattern is prepared, and thereafter, an image of the test pattern is measured using the image acquiring section (S52).

For example, if the coverage ratio (occupied ratio) of the test pattern formed on the photo mask is different, the surface potential of the photo mask is also different when acquiring the image using the image acquiring section (SEM). For this reason, there is a possibility that image distortion state changes. Moreover, the thickness of the photo mask substrate is not uniform in general. For this reason, since the focus position shifts, a magnification error occurs; as a result, there is a possibility that image distortion state changes. Thus, the image acquired by the image acquiring section includes distortion resulting from the photo mask. According to the second embodiment, the test pattern is formed on the photo mask formed with the device pattern. Thereafter, the distortion resulting from the photo mask is corrected using the test pattern.

Figure 13:
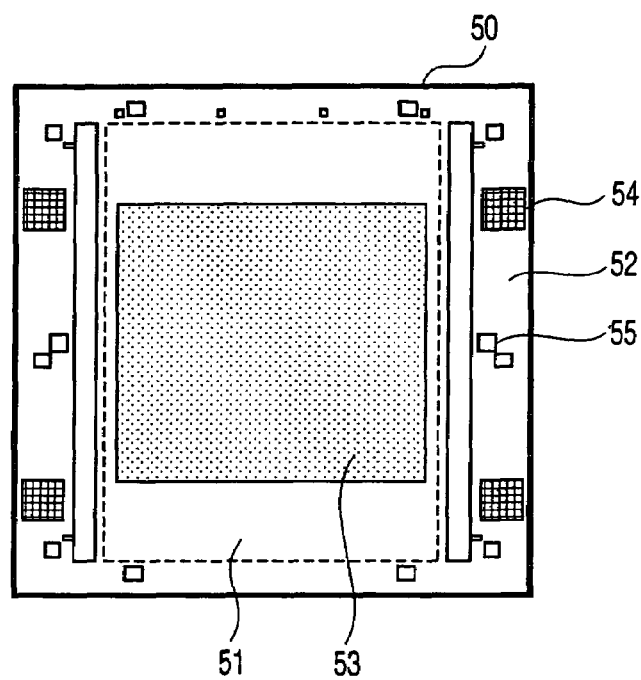
FIG. 13 is a view showing a photo mask according to the second embodiment of the present invention.

FIG. 13 is a schematic view showing a photo mask formed with device pattern and test pattern. An exposure area 51 of a photo mask 50 is formed with a device pattern 53. Test pattern area 54 and alignment mark 55 is formed in a non-exposure area 52 of the photo mask 50.

Figure 14:
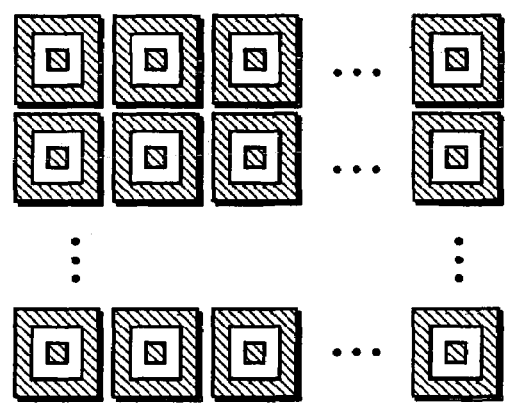
FIG. 14 is a view showing a test pattern according to the second embodiment of the present invention.
Figure 15:
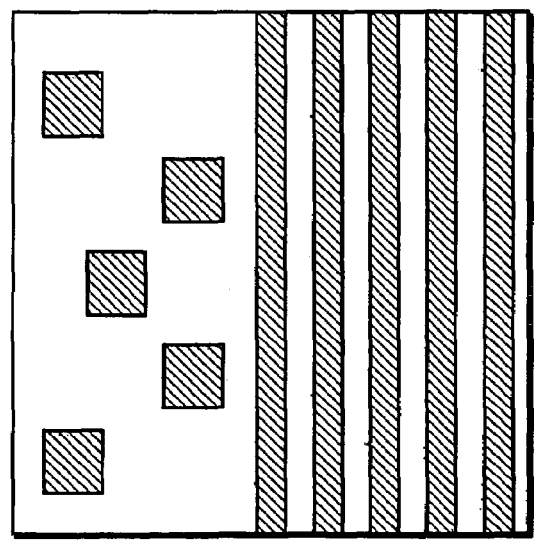
FIG. 15 is a view showing another test pattern according to the second embodiment of the present invention.
Figure 16:
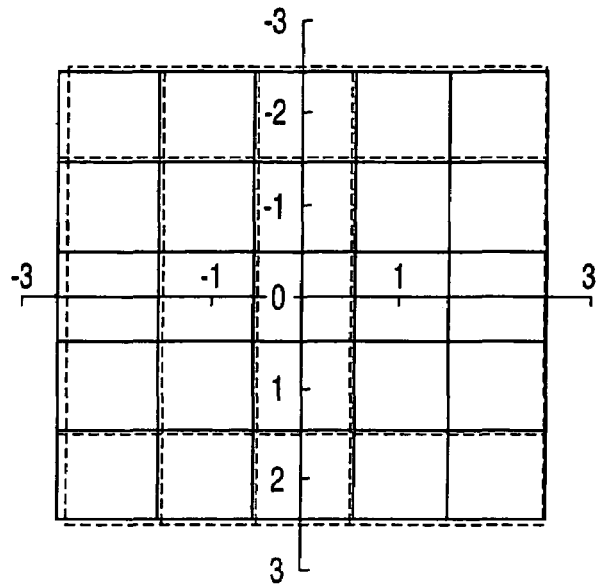
FIG. 16 is a view showing the result measured by test pattern according to the second embodiment of the present invention.
Figure 17:
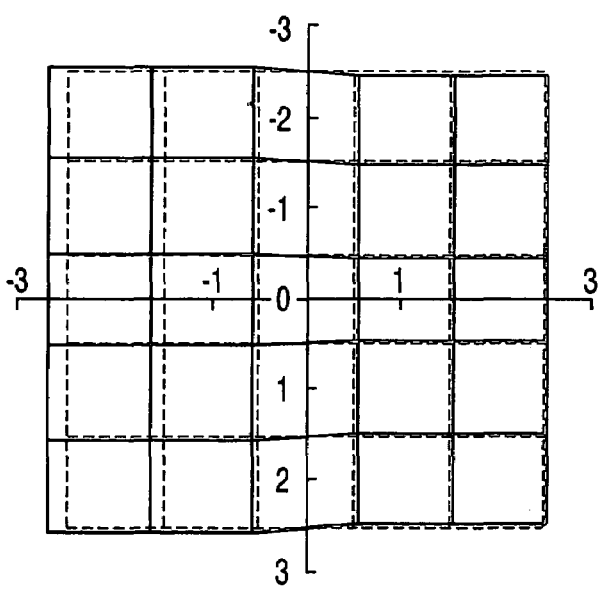
FIG. 17 is a view showing the result measured by test pattern according to the second embodiment of the present invention.

FIGS. 14 and 15 each show example of the test pattern put in test pattern area 54. The test pattern shown in FIG. 14 is the same pattern as the pattern used to calculate the standard image distortion coefficients. The test pattern shown in FIG. 14 is mainly used to correct the magnification error of the device pattern 53. The test pattern shown in FIG. 15 is mainly used to correct an error based on the coverage ratio of the device pattern 53. Any one of the test patterns shown in FIGS. 14 and 15 may be formed on the test pattern area 54. In addition, both of the foregoing patterns may be formed on the test pattern area 54. FIG. 16 is a view showing the result of measuring the distortion of the test pattern shown in FIG. 14. FIG. 17 is a view showing the result of measuring the distortion of the test pattern shown in FIG. 15. In FIGS. 16 and 17, a solid line denotes a lattice based on the measured result while a broken line denotes a lattice based on design data. Preferably, the test pattern shown in FIG. 15 has substantially the same coverage ratio (ratio of shield portion) as the coverage ratio in a predetermined area of the device pattern 53. The predetermined area may be the entire area where the device pattern 53 is formed, or may be an area corresponding to the observing area of the image acquiring section. In this case, it is desirable that the test pattern has substantially the same pattern as the device pattern 53. However, optical proximity correction (OPC) is usually made with respect to the device pattern 53. In general, the pattern to which the foregoing OPC is made has a complicated shape. Thus, if the pattern to which the OPC is made is used as the test pattern 54, image distortion measurement becomes complicated. Therefore, it is preferable to put no OPC pattern in the test pattern 54. The image acquisition part of a device pattern is already decided when a mask pattern has been designed, so some test patterns according to the rate of covering of each image acquisition part can be put.

The image of a test pattern is measured using the foregoing test pattern area 54. Thereafter, the test pattern image measured result is compared with the standard image measured result stored in the data storage section (S53). It is determined whether or not the comparative result satisfies a predetermined condition (S54). For example, it is determined whether or not an error of the test pattern image measured result with respect to the standard image measured result is within a predetermined range.

For example, the test pattern shown in FIG. 14 is used. In this case, a photo mask formed with the same pattern as the pattern shown in FIG. 14 as a standard pattern (i.e., photo mask other than the photo mask of FIG. 13 for standard pattern image acquisition) is used. Using the foregoing photo mask, a standard pattern image is previously measured by the image acquiring section. The measured result is stored in the data storage section as the standard image measured result of the step S51. Image distortion exists in the standard pattern image acquired by the image acquiring section. An error based on the distortion (i.e., error with respect to design data) is expressed by the following equation (2).

$$Ex(j)=Mx \times X(j)-(Rot+Skew) \times Y(j)$$

$$Ey(j)=My \times Y(j)+Rot \times X(j) \qquad (2)$$

where,

Ex(j) and Ey(j): error in X- and Y-directions at the point j

X(j) and Y(j): position in X- and Y-directions at the point j

Mx and My: error component in X- and Y-directions relevant to magnification

Rot and Skew: error component relevant to rotation and skew

Simultaneously, correction coefficients for correcting pixel size two-dimensional distribution obtained in steps S11 and S12 described in the first embodiment are stored in the data storage section as the standard image distortion coefficient.

Moreover, in the photo mask formed with the test pattern area 54 (i.e., photo mask of FIG. 13), errors Ex(J)' and Ey(j)' with respect to design data are calculated in the same manner as described above. Then, error components Mx', My', Rot' and Skew' are acquired.

If it is determined in step S54 that the predetermined condition is satisfied, procedures from steps S61 to S64 are taken. The basic procedures from steps S61 to S64 are the same as steps S21 to S24 described in the first embodiment. Specifically, an image of the device pattern 53 formed on the photo mask 50 is acquired by the image acquiring section (S61). Then, outline data (edge data) is extracted from the image thus acquired (S62). The outline data is corrected using the standard image distortion coefficient (correction data) stored in the data storage section (S63). Using the corrected outline data thus obtained, lithography simulation is carried out (S64).

If it is determined in step S54 that the predetermined condition is not satisfied, procedures from S71 to S75 are taken. The basic procedures from steps S71 to S75 are the same as steps S21 to S24 described in the first embodiment. In steps S71 to S75, correction is made to reflect the test pattern image measured result.

Distortion correction coefficient is calculated based on the test pattern image measured result (S71). Here, the following case is described. In the case, error components Mx' and My' relevant to magnification acquired in step S52 do not satisfy the predetermined condition in step S54, so the distortion measurement pattern image measured result in the test pattern area 54 is reflected for the magnification correction. In this case, the equation (1) of the first embodiment is expressed by the following equation (3).

$$Psx'=(1+Mx') \times Psx$$

$$Psy'=(1+My') \times Psy \qquad (3)$$

Specifically, coefficients Ax, Bx, Cx, Dx, Ex and Fx of the equation (1) are multiplied by (1+Mx'). Coefficients Ay, By, Cy, Dy, Ey and Fy of the equation (1) are multiplied by (1+My'). These coefficients multiplied by (1+Mx') or (1+My') are used as distortion correction coefficient.

The distortion correction coefficient is calculated in the manner described above. Thereafter, the image of the device pattern 53 formed on the photo mask 50 is acquired by the image acquiring section (S72). Then, outline data (edge data) is extracted from the acquired image (S73). The outline data is corrected using the distortion correction coefficient (correction data) calculated in step S71 (S74). Using the corrected outline data thus obtained, lithography simulation is carried out (S75).

In a case where an error based on coverage ratio of the device pattern 53 is corrected, distortion measured result (FIG. 17) of a distortion measurement pattern shown in FIG. 15, which has a coverage ratio equal to the image acquiring section, is reflected in step S71.

In the second embodiment, the outline of the pattern obtained by the image acquiring section is extracted, and correction for correcting image distortion is made with respect to the extracted outline like the first embodiment. Therefore, the amount of data required for correction is largely reduced like the first embodiment. As a result, the calculation time is largely shortened while data storage capacity is largely reduced. Moreover, even if the amount of data is largely reduced, image distortion is accurately corrected; therefore, a pattern is acquired with high accurate.

According to the second embodiment, the test pattern is provided on the photo mask on which the device pattern is provided. Thus, correction is made taking distortion resulting from the photo mask into consideration; therefore, a pattern is acquired with high accurate.

Figure 18:
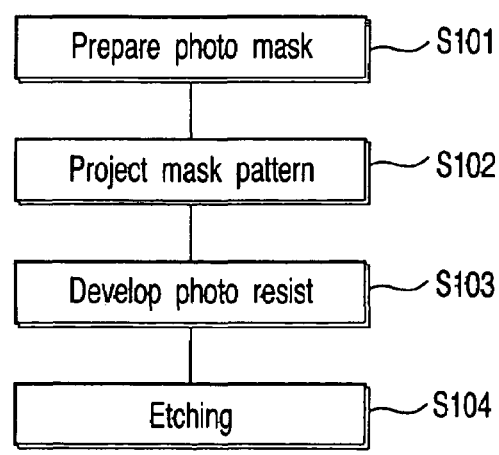
FIG. 18 is a flowchart to explain a method of manufacturing a semiconductor device according to an embodiment of the present invention.

FIG. 18 is a flowchart to explain the method of manufacturing a semiconductor device (semiconductor integrated circuit) using the photo mask described in the foregoing first and second embodiments. First, a photo mask is prepared (S101), and then, a mask pattern (device pattern) on the photo mask is projected onto photo resist on wafer (semiconductor substrate)(S102). The photo resist is developed to form a photo resist pattern (S103). Conductive film or insulating film on the semiconductor substrate is etched using the photo resist pattern as a mask, and thereby, a desired pattern is formed (S104).

The procedures of the method described in the foregoing first and second embodiments are realized using a computer whose operation is controlled according to a program describing the procedures of the method. The program is provided via recording medium such as magnetic disk or communication network (wired or radio communication) such as Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image data correction method comprising:
   preparing correction data for correcting a distorted image obtained by an image acquiring section;
   acquiring outline data of a first image of a desired pattern obtained by the image acquiring section, the desired pattern being formed on a substrate; and
   correcting the outline data of the first image of the desired pattern using the correction data.

2. The method according to claim 1, wherein preparing the correction data includes:
   acquiring image data of a standard pattern by the image acquiring section; and
   calculating the correction data using the image data of the standard pattern.

3. The method according to claim 1, wherein the correction data is based on distortion distribution of the image obtained by the image acquiring section.

4. The method according to claim 1, wherein the correction data depends on a magnification of the image obtained by the image acquiring section.

5. The method according to claim 1, wherein the correction data depends on an occupied ratio of a pattern included in the image obtained by the image acquiring section.

6. The method according to claim 1, wherein preparing the correction data includes:
   acquiring image data of a test pattern provided on a mask on which the desired pattern is provided by the image acquiring section; and
   calculating the correction data using the image data of the test pattern.

7. The method according to claim 6, wherein the test pattern is provided in a non-exposure area outside an exposure area where the desired pattern is provided.

8. The method according to claim 6, wherein the test pattern is used to correct a magnification error of the desired pattern acquired by the image acquiring section.

9. The method according to claim 6, wherein the test pattern has an occupied ratio corresponding to an occupied ratio of the desired pattern.

10. The method according to claim 6, wherein the correction data is calculated using the image data of the test pattern if the image data of the test pattern acquired by the image acquiring section does not satisfy a predetermined condition.

11. The method according to claim 1, wherein the image acquiring section includes an electron microscope.

12. The method according to claim 1, wherein the substrate is a mask substrate for pattern fabrication on wafer by lithography.

13. A lithography simulation method comprising:
   preparing correction data for correcting a distorted image obtained by an image acquiring section;
   acquiring outline data of a first image of a desired pattern obtained by the image acquiring section, the desired pattern being formed on a substrate;
   correcting the outline data of the first image of the desired pattern using the correction data; and
   carrying out lithography simulation with respect to the desired pattern using the corrected outline data.

14. An image data correction system comprising:
   a correction data storage section storing correction data for correcting a distorted image obtained by an image acquiring section;
   an outline data storage section storing outline data of a first image of a desired pattern obtained by the image acquiring section the desired pattern being formed on a substrate; and
   a correction section correcting the outline data of the first image of the desired pattern using the correction data.

15. A computer program product configured to store program instructions for execution on a computer, the program instructions causing the computer to perform:
   acquiring correction data for correcting a distorted image obtained by an image acquiring section;
   acquiring outline data of a first image of a desired pattern obtained by the image acquiring section, the desired pattern being formed on a substrate; and
   correcting the outline data of the first image of the desired pattern using the correction data.

16. A mask comprising:
   a substrate;
   a desired pattern formed on the substrate; and
   a test pattern formed on the substrate and used for calculating correction data for correcting outline data of a first image of the desired pattern obtained by an image acquiring section.

17. The mask according to claim 16, wherein the test pattern is provided in a non-exposure area outside an exposure area where the desired pattern is provided.

18. A method of manufacturing a semiconductor device, comprising:
   preparing the mask of claim 16; and
   projecting the desired pattern provided on the mask onto a resist film on a semiconductor substrate.

* * * * *

UNITED STATES PATENT AND TRADEMARK OFFICE
CERTIFICATE OF CORRECTION

PATENT NO. : 7,313,781 B2 Page 1 of 1
APPLICATION NO. : 11/138408
DATED : December 25, 2007
INVENTOR(S) : Asano et al.

It is certified that error appears in the above-identified patent and that said Letters Patent is hereby corrected as shown below:

Column 12, line 14, change "section the" to --section, the--.

Signed and Sealed this

Twenty-ninth Day of April, 2008

JON W. DUDAS
*Director of the United States Patent and Trademark Office*